(12) United States Patent
Edwards et al.

(10) Patent No.: US 6,937,248 B2
(45) Date of Patent: Aug. 30, 2005

(54) PIXEL ARRAY WITH INDIRECTLY ASSOCIATED MEMORY

(75) Inventors: Martin J. Edwards, Crawley (GB); John R. A. Ayres, Reigate (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 281 days.

(21) Appl. No.: 10/198,502

(22) Filed: Jul. 18, 2002

(65) Prior Publication Data

US 2003/0020684 A1 Jan. 30, 2003

(30) Foreign Application Priority Data

Jul. 26, 2001 (GB) .............................................. 0118183

(51) Int. Cl.[7] .............................. G06F 12/06; G09G 3/36
(52) U.S. Cl. ......................................... 345/571; 345/87
(58) Field of Search ....................... 345/76–84, 87–100, 345/530, 571

(56) References Cited

U.S. PATENT DOCUMENTS 5,945,972 A  *  8/1999  Okumura et al. ............. 345/98
5,952,991 A     9/1999  Akiyama ...................... 345/98
6,140,983 A    10/2000  Quanrud ....................... 345/55
6,563,480 B1 *  5/2003  Nakamura .................... 345/82

* cited by examiner

Primary Examiner—Regina Liang
Assistant Examiner—Duc Q Dinh

(57) ABSTRACT

A pixellated device (10), such as a display, has pixel row and column address lines (18,20) for addressing each pixel, thereby providing signal data to each pixel (12) or reading signal data from each pixel. An array of memory cells (22) is provided on the substrate interspersed with the pixel drive circuitry (16), wherein memory address circuitry (24,26,28, 30) is provided enabling data to be written to each memory cell and enabling data to be read from each cell (22), independently of the signal data. Each memory cell (22) is thus addressable independently of the pixel data. Thus, the memory cells do not form part of the pixel circuitry, which allows the memory to be used in a flexible manner. For example, the memory may be used for purposes not directly associated with the driving or addressing of the pixels of the device.

20 Claims, 5 Drawing Sheets

PIXEL ARRAY WITH INDIRECTLY ASSOCIATED MEMORY

This invention relates to pixellated devices, for example liquid crystal displays. In particular, the invention relates to devices in which a memory capability is integrated with the pixel structure.

It has been proposed to integrate memory storage elements into the structure of large area electronic devices. It has also been recognised that the introduction of memory cells does not necessarily require an increase in the size or complexity of the device substrate. For example, liquid crystal display devices typically comprise display elements at the intersection of row and column conductors. Each display element effectively comprises a pixel electrode, which modulates the signal across a portion of liquid crystal material. The signal on the pixel electrode is controlled by a drive transistor and (optionally) a storage capacitor, and the pixel electrode occupies a significantly greater area than the drive transistor/capacitor. If the pixel electrode is able to overlie the electronic components, it is possible to introduce additional components adjacent the drive transistors, without changing the size of the pixel electrodes.

Various different structures have been proposed for the active plate of active matrix liquid crystal displays, in which memory elements are associated with the display pixels. In each case, the purpose of the memory element is to store the pixel data, so that the pixels can be driven from integrated memory elements as well as from applied signal data.

A major benefit of this possibility is that a reduction in power consumption can be achieved. In particular, one problem with conventional displays arises from the need to invert the liquid crystal driving voltages, typically each frame. As a consequence of the 60 Hz frame rate, alternating the polarity gives rise to a 30 Hz signal, which produces flicker. To reduce this flicker, it is known to invert the polarity of the pixel drive signals for adjacent rows of pixels. However, this results in a high power consumption drive scheme.

In EP 0 797 182, a memory element associated with each pixel is used to enable a reduction in power consumption, by avoiding the need to rewrite data to each pixel when the pixel data is unchanged. U.S. Pat. No. 5,952,991 also uses the memory element associated with each pixel to enable a reduction in power consumption. The pixels can be driven in two modes—one in which signal data is applied to the pixel, and one in which memory data is applied to the pixel.

U.S. Pat. No. 6,140,983 provides each pixel with a number of memory cells to enable sub-images to be stored, so that a video sequence can be output from the display without rewriting all pixels, and without writing to the memory cells between sub-images.

Whilst these approaches provide specific benefits to different aspects of the performance of the display, the potential benefits of the memory capability are limited by the specific pixel/memory cell layout in each case.

According to the invention, there is provided an electronic device comprising:

an array of pixels provided on a substrate and arranged in rows and columns and comprising pixel drive circuitry;

a plurality of pixel row and column address lines for addressing each pixel thereby providing signal data to each pixel or reading signal data from each pixel; and an array of memory cells provided on the substrate and interspersed with the pixel drive circuitry, wherein memory address circuitry is provided enabling data to be written to each memory cell and enabling data to be read from each cell, independently of the signal data.

The invention intersperses memory cells with the pixel circuitry. However, each memory cell is addressable independently of the pixel data. Thus, the memory cells are not directly electrically connected to the pixels, and are not necessarily associated with them. Thus, the memory cells do not form part of the pixel circuitry, which allows the memory to be used in a flexible manner. For example, the memory may be used for purposes not directly associated with the driving or addressing of the pixels of the device.

Preferably, the same process steps used to form the circuitry of the pixels and the row and column address lines are used to form the memory cells.

In one example, the memory address circuitry comprises a plurality of row and column memory address lines for addressing each memory cell. In this case, the memory cells are provided with completely independent address lines. Instead, the memory cells may use the pixel column address lines in combination with dedicated memory row address lines. Thus, the column address lines may be shared between the pixels and memory cells. The memory cells are still identifiable by a unique combination of row and column lines. In this case, the signals on the shared column conductors will be time-interleaved, in order to distinguish between pixel addressing signals and memory addressing signals.

Alternatively, the memory cells may be provided with dedicated memory column address lines, and the pixel row address lines may be used for addressing rows of memory cells.

Each memory cell may comprise a transistor and a capacitor, the transistor allowing the capacitor to be charged from a supply line or else isolating the capacitor from the supply line. This provides the typical dynamic memory element. Refreshing of the contents of the memory element may then be integrated into the normal cyclic operation of the electronic device pixels.

The device may comprise a liquid crystal display, with each pixel comprising an addressing transistor and a storage capacitor, together with a portion of liquid crystal material.

There may be an equal number of memory cells as pixels, so that one memory cell is provided in the vicinity of each pixel. Alternatively, a number of memory cells may be associated (in terms of location) with each pixel so that the number of memory cells is an integer multiple of the number of pixels.

Examples of the invention will now be described in detail with reference to the accompanying drawings, in which.

The same reference numerals are used throughout the figures for the same components.

Figure 1:
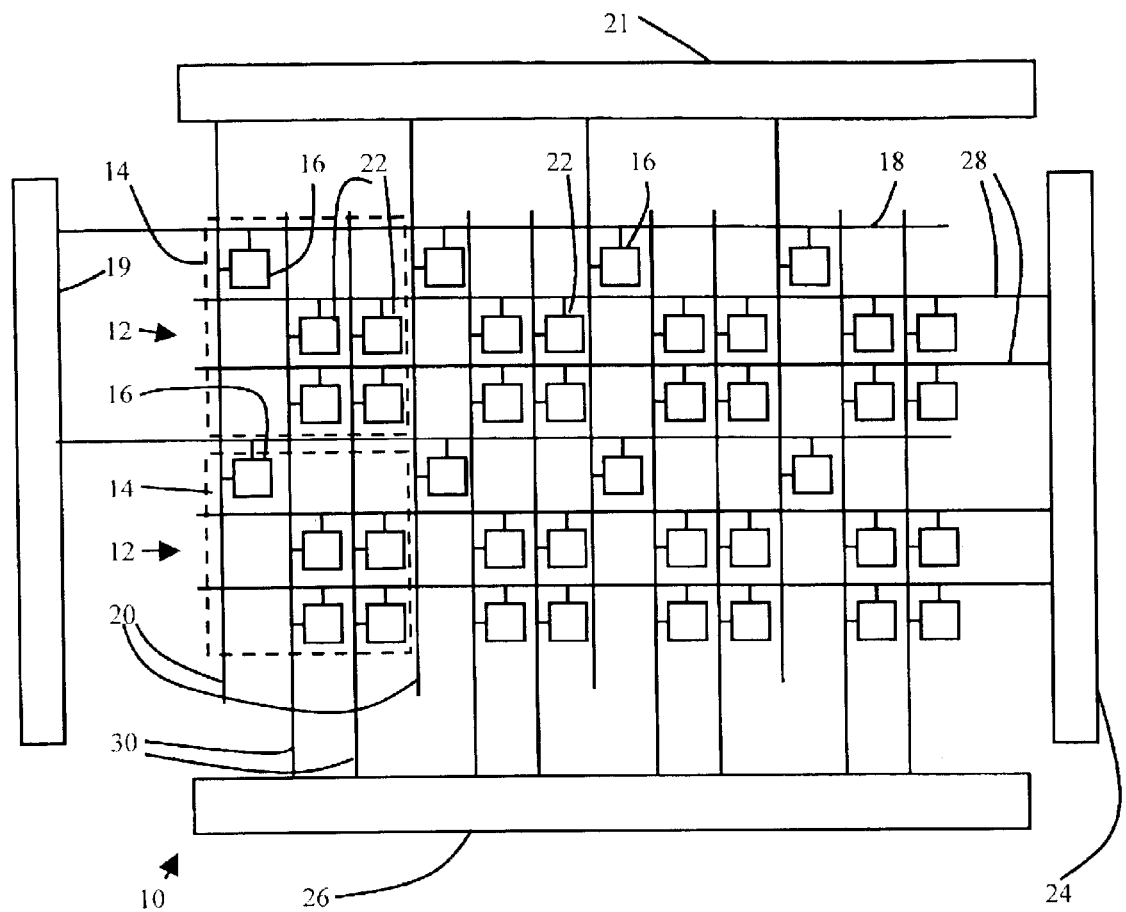
FIG. 1 shows an electronic device according to the invention.

FIG. 1 shows an electronic device 10 of the invention. The device comprises an array of pixels 12 provided on a common substrate and arranged in rows and columns. Each pixel 12 has an effective pixel area 14, although the electronics 16 associated with each pixel occupies a significantly smaller area. For example, the area 14 may be defined by a pixel electrode, whereas the pixel electronics 16 comprises electronic components for driving the pixel electrode to a required voltage. Each row of pixels shares a common row address line 18, and each column of pixels shares a common column address line 20. The row and column lines 18, 20 enable signal data to be provided to each pixel, or else enable signal data on each pixel to be read. A row driver circuit 19 and a column address circuit 21 control the signals on the row and column lines.

Within the area 14 of each pixel, there is provided one or more memory cells 22. In the example shown in FIG. 1, four memory cells 22 are provided within the area 14 of each pixel. In accordance with the invention, memory address circuitry 24, 26 is provided to enable data to be written to each memory cell, and to enable data to be read from each memory cell, independently of the signal data associated with each pixel.

As shown in FIG. 1, the memory address circuitry comprises row address circuitry 24 and column address circuitry 26. Each memory cell 22 is associated with a unique pair of row and column memory address lines 28, 30. The memory cells 22 do not form part of the circuitry 16 of the pixels, and are not directly connected to the circuitry 16 of the pixels. Instead, if data from the memory cells 22 is to be provided to the pixels, communication between the row and column driver circuits of the pixels and of the memory cells is required.

In the example of FIG. 1, the memory cells 22 are associated with separate memory address circuitry 24, 26. Furthermore, separate row and column address lines 28, 30 are provided for the memory cells 22. However, it is equally possible for the pixel row or column address lines to be shared between the pixel circuit 16 and the memory cells 22.

Figure 2:
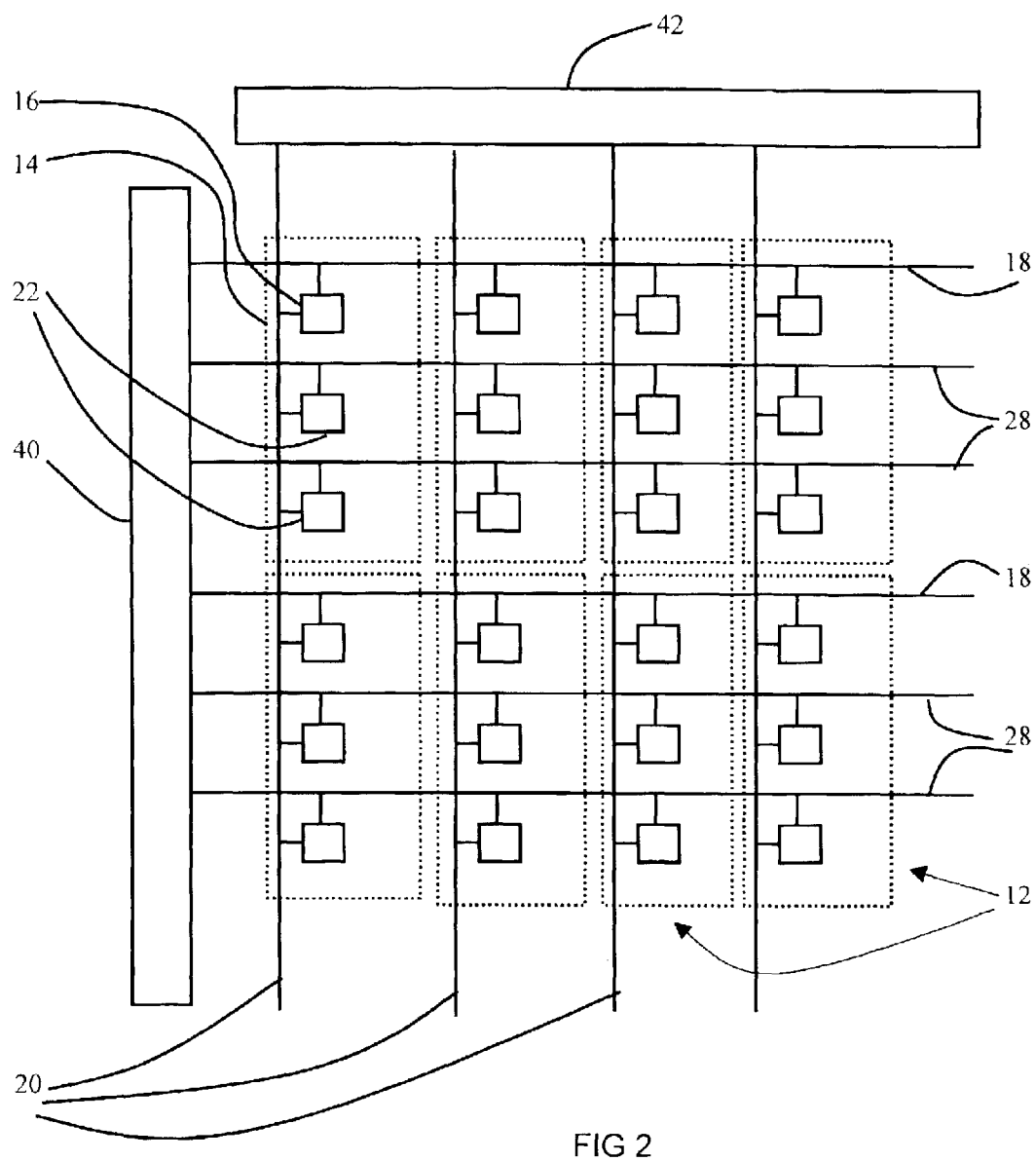
FIG. 2 shows a second example of electronic device according to the invention.

In the example of FIG. 2, the pixel circuitry 16 and two memory cells 22 are provided within the area 14 of each pixel. The memory cells 22 are associated with the column conductors 20 of the pixel array, but are provided with dedicated row conductors 28. Each memory cell 22 is still associated with a unique combination of row and column conductors, but the total number of conductors required is reduced. When providing signals to or reading signals from the column address lines 20, signals associated with the memory cells 22 must be separated in time from signals associated with the pixel circuitry 16. In FIG. 2, the pixel row address circuitry is combined with the memory cell row address circuitry forming a combined row driver 40. Likewise, the pixel column address circuitry is combined with the memory cell column address circuitry to provide a combined column driver 42.

The pixellated device of FIG. 1 or FIG. 2 may take various forms. Essentially, any device arranged in an array of pixels may benefit from this invention if memory cells can be fabricated from similar devices to those used in the pixel circuits 16.

For example, the pixel circuits may comprise image sensor pixels. The large area 14 of each pixel then effectively comprises the light receptive area of a photodiode sensor, whereas the circuitry 16 comprises switching devices enabling charge to be provided to and removed from the photodiode. Alternatively, the device may comprise a liquid crystal display. There are other large area pixellated devices to which the invention may be applied, but the example of a liquid crystal display will now be described in greater detail.

Figure 3:
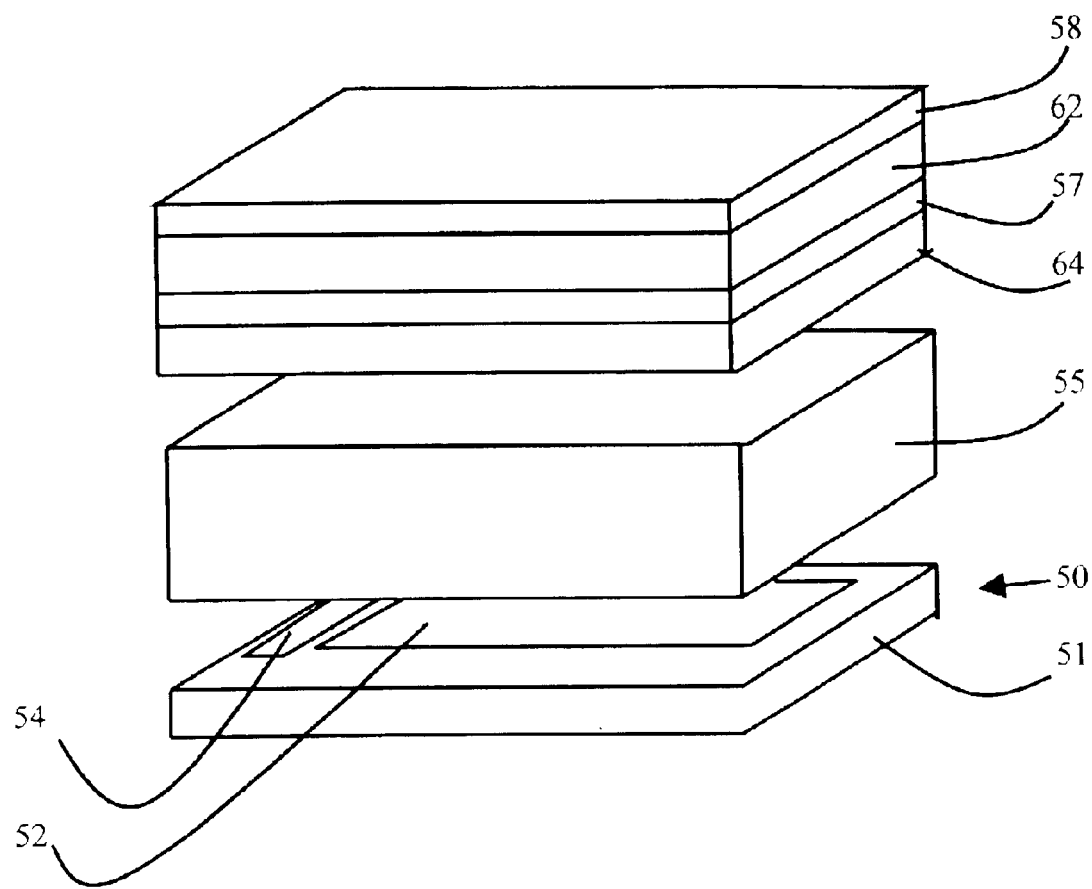
FIG. 3 shows a liquid crystal display, to which the invention may be applied.

FIG. 3 shows a liquid crystal display, having an active plate 50 which comprises a substrate 51 over which there is provided an array 52 of pixel electrodes with associated switching transistors. The signals supplied to the pixel electrodes are controlled by row and driver circuits 54, also provided on the substrate. A layer of liquid crystal material 55 is provided over the active plate 50. A further substrate 56 overlies the layer of liquid crystal material. This further substrate 56 may be provided on one face with an arrangement of colour filters 57 and a plate defining a common electrode 64 for the liquid crystal material (explained further in connection with in FIG. 4). A polarizing plate 58 is also provided on the opposite side of the substrate 56.

Figure 4:
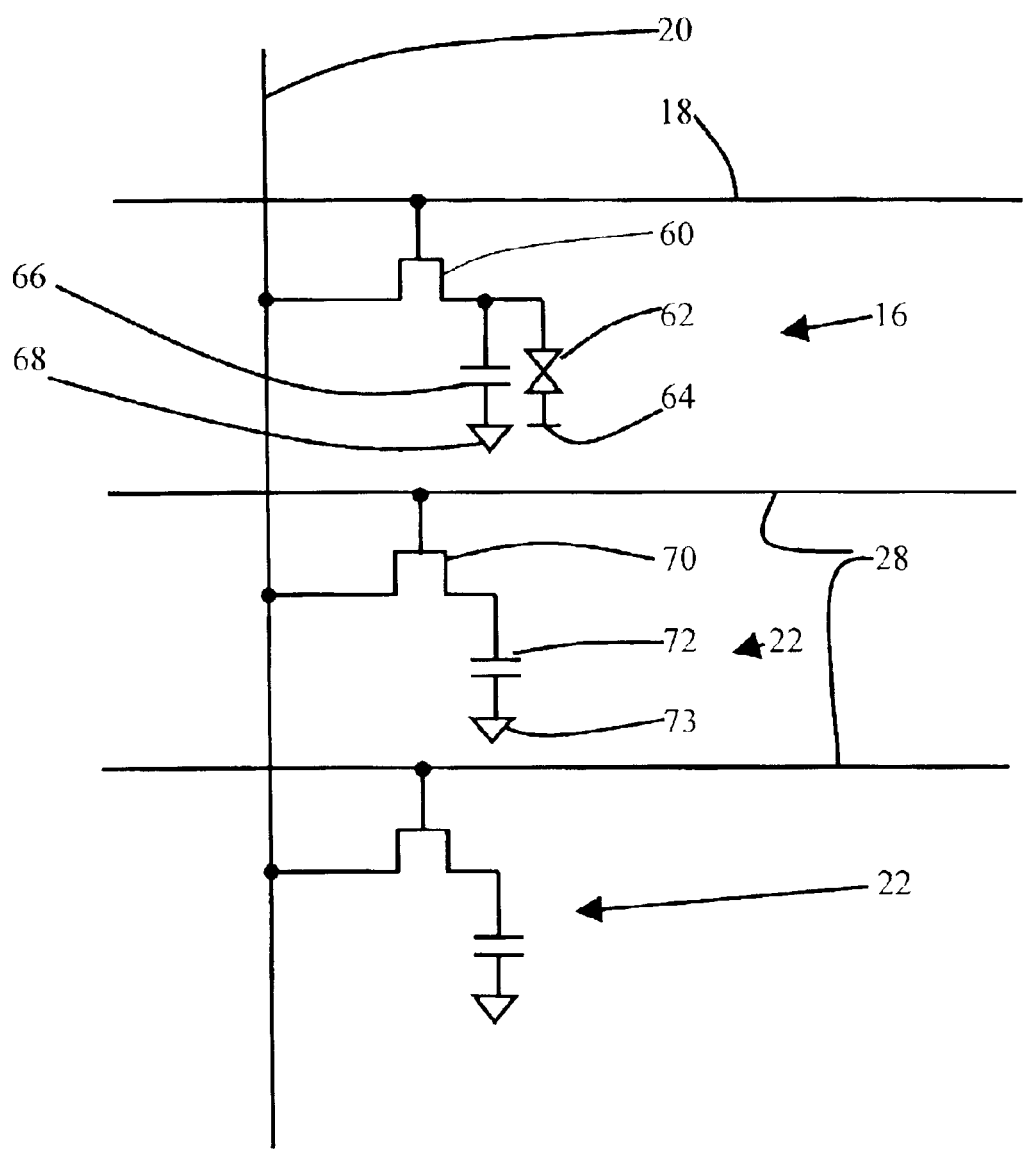
FIG. 4 shows the pixel and memory cell circuit diagram for one pixel area of the device of FIG. 2 in which the pixels comprise liquid crystal display pixels.

FIG. 4 shows the components located within the area of one pixel for a liquid crystal display device, when there are two memory cells within the vicinity of each pixel (as in FIG. 2).

Each pixel area comprises the pixel circuitry 16 and two memory cells 22. The pixel circuitry 16 comprises a thin film transistor 60 and a liquid crystal cell 62 arranged in series between the column conductor 20 and the common electrode 64. The transistor 60 is switched on and off by a signal provided on the row conductor 18. The row conductor 18 is thus connected to the gate of each transistor 60 of the associated row of pixels. Each pixel additionally comprises a storage capacitor 66, which in this example is connected to a separate capacitor electrode 68. It is instead possible for the storage capacitors to be connected to the previous row conductor, as will be apparent to those skilled in the art. The capacitor stores a drive voltage so that a signal is maintained across the liquid crystal cell 62 even after the transistor 60 has been turned off.

In order to drive the liquid crystal cell 62 to a desired voltage to obtain a required grey level, an appropriate signal is provided on the column conductor 20 in synchronism with a row address pulse on the row conductor 18. This row address pulse turns on the thin film transistor 60, thereby allowing the column conductor 20 to charge the liquid crystal cell 62 to the desired voltage, and also to charge the storage capacitor 66 to the same voltage. At the end of the row address pulse, the transistor 60 is turned off. The storage capacitor 66 maintains a voltage across the cell 62 and reduces the effect of liquid crystal leakage, as well as reducing the percentage variation in the pixel capacitance caused by the voltage dependency of the liquid crystal cell capacitance.

Each memory cell 22 of the pixel area is associated with a different row conductor 28, but the column conductor 20 is shared. Each memory cell is thus associated with a unique combination of row and column address lines, and can therefore be addressed independently of the pixel circuitry 16.

Each memory cell 22 comprises a thin film transistor 70 and a storage capacitor 72. The thin film transistors 70 are again switched on or off by the associated row conductors 28, thereby enabling a signal on the column conductor 20 to charge (or discharge) the storage capacitor 72. The storage capacitors of each memory cell are connected to a common electrode 73, which may be the same electrode as the common electrode 64 of the pixel circuits.

It can be seen that the memory cells are fabricated from similar components to the components of the pixel circuitry 16. This enables layers within the structure to be shared between the different circuits, so that the introduction of the memory cells introduces minimum additional complexity to the manufacturing process. In particular, the same process steps are used to form the pixel circuits and the memory cells. It is possible to introduce no additional processing steps, although in some circumstances it may be necessary to introduce additional steps into the process. For example, an extra level of metallization may be added in order to simplify the layout of the memory cell circuits.

In the case of liquid crystal display devices, the invention has particular benefit for reflective displays. In such devices, the presence of additional circuits in the vicinity of the pixels does not affect the optical characteristics of the display, as they will lie beneath the reflective pixel electrode.

Figure 5:
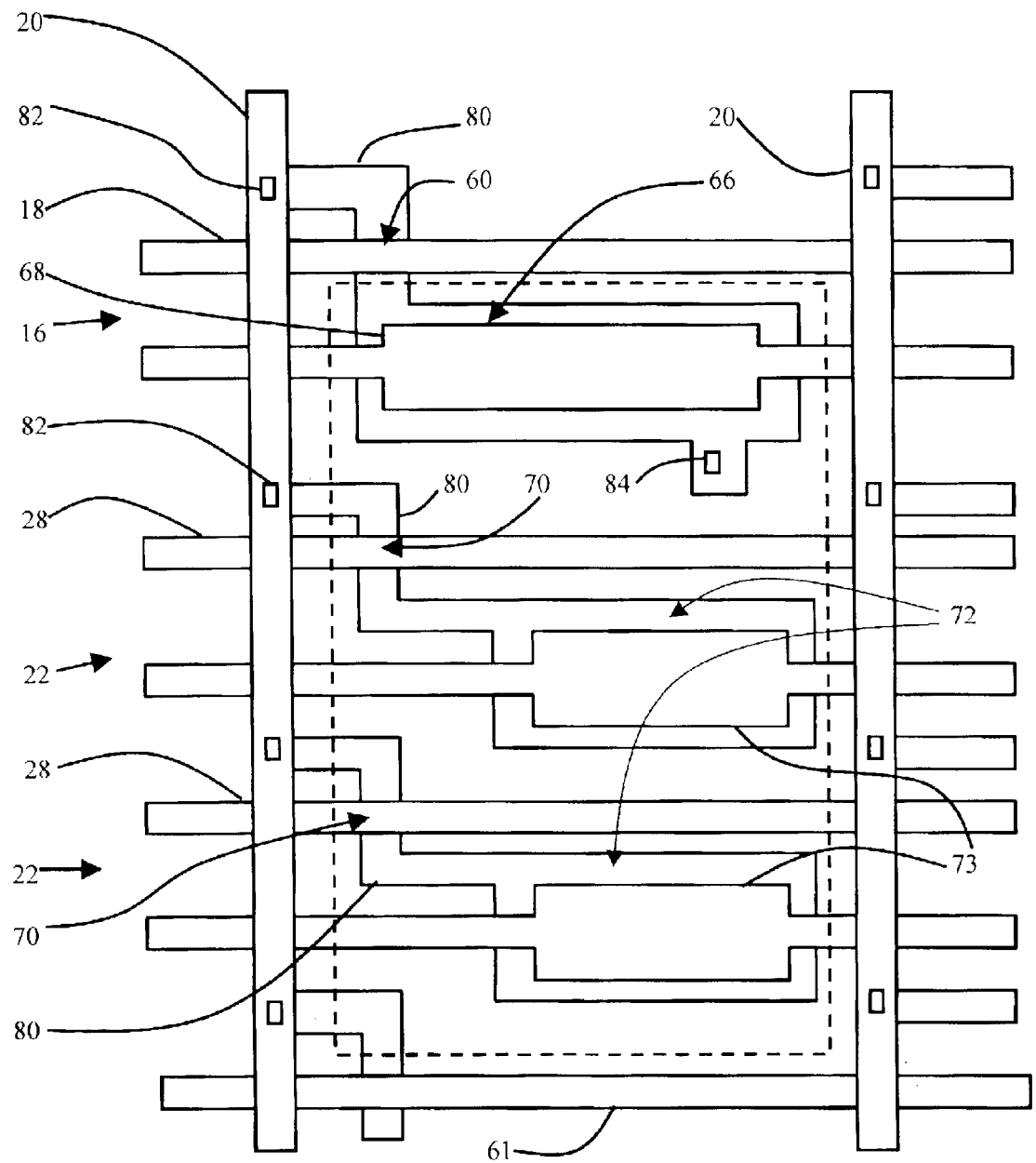
FIG. 5 shows in greater detail the pixel and memory cell layout of FIG. 4.

FIG. 5 shows schematically one possible arrangement of layers used to form the circuit shown in FIG. 4. The structure is deposited on a common substrate, which may be provided with a planarization layer over the top surface. A patterned semiconductor (polycrystalline silicon) layer is deposited over the substrate defining the regions 80 shown in FIG. 5.

The semiconductor layer 80 is then processed using an additional doping step in order to implant dopant into areas of the polysilicon excluding those polysilicon areas which will form the semiconductor transistor 60,70 channels. This provides n-doped semiconductor regions, which have sufficient conductivity to be used to form electrodes within the circuits.

A gate dielectric layer overlies the patterned and partially doped semiconductor layer, and the row electrodes 18, 28 as well as the capacitor top plates 68, 73 are deposited as a common metallization layer over the gate dielectric. The transistors 60, 70 are defined at the points where the row conductors 18, 28 cross over the undoped semiconductor patterns. In this way, top gate transistor structures are defined (with undoped channels). The higher conductivity doped semiconductor areas form the lower capacitor electrodes.

The pixel capacitor 66 is therefore defined by the gate dielectric layer between the common electrode 68, defining one capacitor electrode, and the doped semiconductor layer 80, which defines the opposite electrode of the capacitor. Each memory cell capacitor 72 is defined by the gate dielectric layer between the common electrode 73 and the doped semiconductor layer 80 of the transistors 70 of the memory cells 22. A multiple-layer dielectric may be used, so that different dielectric thicknesses can be defined for the gate dielectric layer and for the capacitor dielectric layers.

The column conductors 20 overlie this structure, and make contact to the source or drain of each transistor through vias 82. The pixel electrodes 61 overly this structure (over a planarising insulator) and make contact with the transistor 60 through via 84. The arrangement shown in FIG. 5 thus provides the circuit layout of FIG. 4.

Instead of providing selective doping of the semiconductor layer to enable it to form capacitor electrodes, a DC voltage may be applied to the pixel top metal electrodes which is sufficient to invert the underlying silicon, thereby making the underlying silicon conducting.

By providing independent memory cells, there is greater flexibility in the layout of the memory cells and the pixels, since they are only indirectly linked. It is not necessary to locate the memory cells associated with a particular pixel within that pixel.

Existing proposals in which memory cells are associated with the pixels for storing the pixel data require conversion circuitry to enable conversion between the digital data stored in the memory cells and the analogue signal data of the pixel. This requires conversion circuitry integrated within the array of pixels. The independent access to the memory cells and the pixels, provided by the invention, avoids the need to integrate data conversion circuitry within the pixels of the display. Instead, any required conversion circuitry can be included within the column address circuitry (namely the memory address circuitry/pixel address circuitry) of the active matrix display, thus increasing the area available for the memory cells within (or beneath) the active matrix of the display.

The memory structure may be used as a simple frame store for holding the video information to be shown on the display. However, the memory cells in the circuits of the invention can be used for functions other than holding the video information associated with any particular display pixel. In this way, the memory cells can be used to increase the functionality of the display in various ways. For example, the memory may also be used to store information unrelated to the pixel information, for example pages of information such as ASCII characters which can be viewed on the display as additional information. Alternatively, the memory arrangement may be used for storing information completely unrelated to the information to be displayed, for example information concerning operation of the display, or even relating to other parts of the apparatus incorporating the display.

There are many techniques which can be used for forming the memory cells. Essentially, conventional techniques used for forming MOS memories can be applied, although thin film transistors will be used in place of conventional crystalline silicon transistors. The memory cells may even be formed using ferroelectric or other materials which can be switched in a controlled way between two stable states. The use of some types of memory elements may require additional electrodes to be used to operate the memory circuits, for example a power source in the case of static RAM type memory cells.

The memory cells may provide a read and write function, similar to conventional SRAM, DRAM or EEPROM memories, but the memory may also operate as a read only memory (ROM) to provide permanent storage of data within the display.

The methods of operating the pixels in the display and the methods of operating the memory cells are well known to those skilled in the art, and are not described in detail. Of course, if row or column address lines are shared between the memory cells and the pixel circuits, the reading or writing of data to the memory cells will need to be interleaved in time with the addressing of display pixels.

In the examples above, each pixel circuit is associated with two or four memory cells. There may in practice be many more memory cells associated with each pixel, depending on the amount of space available within each pixel area.

The specific example shows layers shared between the pixel circuits and the memory cell circuits, so that the pixels and cells are effectively on the same plane over the substrate. It is possible to provide the pixel circuits and the memory cell circuits on different levels over the substrate. Although this will increase the manufacturing complexity, this is considered to lie within the scope of the invention.

Various modifications will be apparent to those skilled in the art.

What is claimed is:

1. An electronic device comprising:
   an array of pixels provided on a substrate and arranged in rows and columns and comprising pixel drive circuitry;
   a plurality of pixel row and column address lines for addressing each pixel thereby providing signal data to each pixel or reading signal data from each pixel; and
   an array of memory cells provided on the substrate and interspersed with the pixel drive circuitry, wherein memory address circuitry is provided enabling data to be written to each memory cell and enabling data to be read from each cell, independently of the pixel drive circuitry.

2. A device as claimed in claim 1, wherein the memory address circuitry comprises a plurality of row and column memory address lines for addressing each memory cell.

3. A device as claimed in claim 1, wherein the memory address circuitry comprises a plurality of memory row address lines, and wherein each memory cell is addressed using an associated memory row address line and one of the pixel column address lines.

4. A device as claimed in claim 1, wherein the memory address circuitry comprises a plurality of memory column address lines, and wherein each memory cell is addressed using an associated memory column address line and one of the pixel row address lines.

5. A device as claimed in claim 1, wherein each memory cell comprises a transistor and a capacitor, the transistor allowing the capacitor to be charged from a common supply or else isolating the capacitor from the common supply.

6. A device as claimed in claim 1 comprising a liquid crystal display device, wherein each pixel comprises an addressing transistor and a storage capacitor, the addressing transistor allowing the capacitor to be charged from a common supply or else isolating the capacitor from the common supply.

7. A device as claimed in claim 1 comprising an equal number of memory cells as pixels.

8. A device as claimed in claim 1 comprising a number of memory cells which is an integer multiple, equal to or greater than two, of the number of pixels.

9. A device as claimed in claim 1, wherein the memory address circuitry comprises conversion circuitry for converting between signal data and memory cell data formats.

10. A device as claimed in claim 2, wherein each memory cell comprises a transistor and a capacitor, the transistor allowing the capacitor to be charged from a common supply or else isolating the capacitor from the common supply.

11. A device as claimed in claim 10, comprising a liquid crystal display device, wherein each pixel comprises an addressing transistor and a storage capacitor, the addressing transistor allowing the capacitor to be charged from a common supply or else isolating the capacitor from the common supply.

12. A device as claimed in claim 11, wherein the memory address circuitry comprises conversion circuitry for converting between signal data and memory cell data formats.

13. A device as claimed in claim 3, wherein each memory cell comprises a transistor and a capacitor, the transistor allowing the capacitor to be charged from a common supply or else isolating the capacitor from the common supply.

14. A device as claimed in claim 13, comprising a liquid crystal display device, wherein each pixel comprises an addressing transistor and a storage capacitor, the addressing transistor allowing the capacitor to be charged from a common supply or else isolating the capacitor from the common supply.

15. A device as claimed in claim 4, wherein each memory cell comprises a transistor and a capacitor, the transistor allowing the capacitor to be charged from a common supply or else isolating the capacitor from the common supply.

16. A device as claimed in claim 15, comprising a liquid crystal display device, wherein each pixel comprises an addressing translator and a storage capacitor, the addressing transistor allowing the capacitor to be charged from a common supply or else isolating the capacitor from the common supply.

17. A device as claimed in claim 2, comprising a liquid crystal display device, wherein each pixel comprises an addressing transistor and a storage capacitor, the addressing transistor allowing the capacitor to be charged from a common supply or else isolating the capacitor from the common supply.

18. A device as claimed in claim 3, comprising a liquid crystal display device, wherein each pixel comprises an addressing transistor and a storage capacitor, the addressing transistor allowing the capacitor to be charged from a common supply or else isolating the capacitor from the common supply.

19. A device as claimed in claim 4, comprising a liquid crystal display device, wherein each pixel comprises an addressing transistor and a storage capacitor, the addressing transistor allowing the capacitor to be charged from a common Supply or else isolating the capacitor from the common supply.

20. A display device comprising:
a plurality of picture elements, each picture element of the plurality of picture elements having an associated pixel area, and
a plurality of memory elements dispersed throughout the pixel areas of the plurality of picture elements,
wherein,
the memory elements are electrically isolated from the picture elements.

* * * * *